(12) United States Patent
Murata et al.

(10) Patent No.: US 11,107,760 B2
(45) Date of Patent: Aug. 31, 2021

(54) SEMICONDUCTOR DEVICE, ELECTRIC POWER CONVERSION APPARATUS AND METHOD FOR MANUFACTURING SEMICONDUCTOR DEVICE

(71) Applicant: Mitsubishi Electric Corporation, Tokyo (JP)

(72) Inventors: Daisuke Murata, Tokyo (JP); Hiroshi Yoshida, Tokyo (JP); Hidetoshi Ishibashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 16/452,001

(22) Filed: Jun. 25, 2019

(65) Prior Publication Data

US 2020/0161233 A1 May 21, 2020

(30) Foreign Application Priority Data

Nov. 19, 2018 (JP) .............................. JP2018-216711

(51) Int. Cl.
*H01L 21/48* (2006.01)
*H01L 23/498* (2006.01)
(Continued)

(52) U.S. Cl.
CPC .... *H01L 23/49838* (2013.01); *H01L 21/4803* (2013.01); *H01L 21/4846* (2013.01);
(Continued)

(58) Field of Classification Search
None
See application file for complete search history.

(56) References Cited

U.S. PATENT DOCUMENTS

2012/0134115 A1 5/2012 Schulz-Harder et al.
2013/0148307 A1 6/2013 Geinitz
(Continued)

FOREIGN PATENT DOCUMENTS

DE 44 06 397 A1 8/1995
DE 10 2009 033 029 A1 1/2011
(Continued)

OTHER PUBLICATIONS

An Office Action mailed by the German Patent and Trademark Office dated Jan. 15, 2021, which corresponds to German Patent Application No. 10 2019 217 502.3 and is related to U.S. Appl. No. 16/452,001; with English language translation.

*Primary Examiner* — Bradley Smith
(74) *Attorney, Agent, or Firm* — Studebaker & Brackett PC

(57) ABSTRACT

According to the present invention, a semiconductor device includes an insulating substrate having an organic insulating layer and a circuit pattern provided on the organic insulating layer; and a semiconductor chip provided on an upper surface of the circuit pattern, wherein a thickness of the circuit pattern is not less than 1 mm and not more than 3 mm. According to the present invention, a method for manufacturing a semiconductor device includes forming a metal layer with a thickness not less than 1 mm and not more than 3 mm on an organic insulating layer; patterning the metal layer by machining processing to form a circuit pattern; and providing a semiconductor chip on an upper surface of the circuit pattern.

10 Claims, 6 Drawing Sheets

(51) Int. Cl.
  *H01L 23/14*    (2006.01)
  *H01L 23/367*   (2006.01)
  *H01L 23/00*    (2006.01)
  *H02M 1/08*     (2006.01)
  *H02M 7/5387*   (2007.01)
  *H01L 23/31*    (2006.01)
  *H02P 27/08*    (2006.01)

(52) U.S. Cl.
  CPC .......... *H01L 23/142* (2013.01); *H01L 23/367* (2013.01); *H01L 24/32* (2013.01); *H01L 24/73* (2013.01); *H02M 1/08* (2013.01); *H02M 7/53871* (2013.01); *H01L 23/3121* (2013.01); *H01L 2224/32225* (2013.01); *H01L 2224/73265* (2013.01); *H01L 2924/1033* (2013.01); *H01L 2924/10254* (2013.01); *H01L 2924/10272* (2013.01); *H02P 27/08* (2013.01)

(56) References Cited

U.S. PATENT DOCUMENTS

| | | | |
|---|---|---|---|
| 2014/0291699 A1 | 10/2014 | Yano et al. | |
| 2015/0092379 A1* | 4/2015 | Yoshimatsu | H05K 3/06 |
| | | | 361/783 |
| 2016/0315023 A1* | 10/2016 | Yoshida | H05K 1/0209 |
| 2016/0336245 A1* | 11/2016 | Egusa | H01R 12/585 |
| 2019/0371695 A1 | 12/2019 | Hatano et al. | |
| 2019/0371701 A1* | 12/2019 | Iwasaki | H05K 1/02 |

FOREIGN PATENT DOCUMENTS

| | | |
|---|---|---|
| DE | 10 2010 039 728 A1 | 3/2012 |
| DE | 10 2014 105 000 A1 | 10/2015 |
| DE | 11 2018 001 769 T5 | 12/2019 |
| JP | H03-145748 A | 6/1991 |
| JP | 2008-282834 A | 11/2008 |

* cited by examiner

SEMICONDUCTOR DEVICE, ELECTRIC POWER CONVERSION APPARATUS AND METHOD FOR MANUFACTURING SEMICONDUCTOR DEVICE

BACKGROUND OF THE INVENTION

Field

The present invention relates to a semiconductor device, an electric power conversion apparatus, and a method for manufacturing a semiconductor device.

Background

JP 2008-282834 A discloses a method for manufacturing a semiconductor device in which a semiconductor chip is stacked on and solder joined onto a copper foil circuit pattern of an insulating substrate. In this method for manufacturing the semiconductor device, the copper foil circuit pattern is irradiated with laser light within the region of the surface of joining to form discrete convex and concave craters. After that, the insulating substrate and the semiconductor chip are joined with solder interposed between these in the region of the surface of joining. The thickness of the copper foil is set to be not less than 0.5 mm in order that any of the craters, which are formed by irradiation with laser light, does not penetrate the copper foil.

In general, organic insulating layers are lower in heat conductivity than ceramic ones. When a circuit pattern with 0.5 mm of thickness is formed on an insulating substrate having such an organic insulating layer, sufficient heat dissipation is possibly not achieved under the influence of the organic insulating layer.

Summary

The present invention is devised in order to solve the aforementioned problem, and an object thereof is to obtain a semiconductor device, an electric power conversion apparatus, and a method for manufacturing a semiconductor device, these being capable of achieving efficient heat dissipation.

The features and advantages of the present invention may be summarized as follows.

According to the present invention, a semiconductor device includes an insulating substrate having an organic insulating layer and a circuit pattern provided on the organic insulating layer; and a semiconductor chip provided on an upper surface of the circuit pattern, wherein a thickness of the circuit pattern is not less than 1 mm and not more than 3 mm.

According to the present invention, a method for manufacturing a semiconductor device includes forming a metal layer with a thickness not less than 1 mm and not more than 3 mm on an organic insulating layer; patterning the metal layer by machining processing to form a circuit pattern; and providing a semiconductor chip on an upper surface of the circuit pattern.

Other and further objects, features and advantages of the invention will appear more fully from the following description.

DESCRIPTION OF EMBODIMENTS

Figure 1:
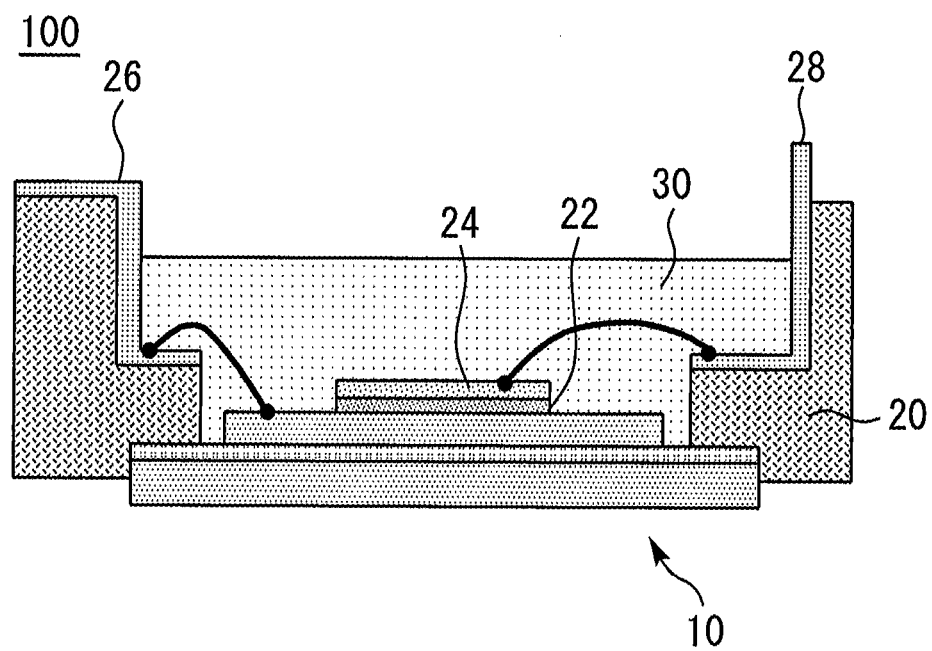
FIG. 1 is a cross-sectional view of a semiconductor device according to a first embodiment.

A semiconductor device, an electric power conversion apparatus, and a method for manufacturing a semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a cross-sectional view of a semiconductor device 100 according to a first embodiment. The semiconductor device 100 includes an insulating substrate 10. A semiconductor chip 24 is provided on the upper surface of the insulating substrate 10. The semiconductor chip 24 is formed, for example, of silicon. The semiconductor chip 24 is joined onto the upper surface of the insulating substrate 10 with a joining material 22. The joining material 22 is, for example, solder. The semiconductor chip 24 is, for example, a switching element such as an IGBT (Insulated Gate Bipolar Transistor).

A casing 20 is provided on the insulating substrate 10 so as to enclose the semiconductor chip 24. The insulating substrate 10 and the casing 20 are bonded together with an adhesive agent or the like. Terminals 26 and 28 are provided on the casing 20. The terminal 26 is connected to a circuit pattern included in the insulating substrate 10 via a wire. The terminal 28 is connected to the semiconductor chip 24 via a wire. The terminals 26 and 28 may be a main electrode terminal and a drive terminal of the semiconductor chip 24, respectively. The interior of the casing 20 is sealed with sealing resin 30 such that it covers the semiconductor chip 24. The sealing resin 30 is formed, for example, of epoxy resin.

Figure 2:
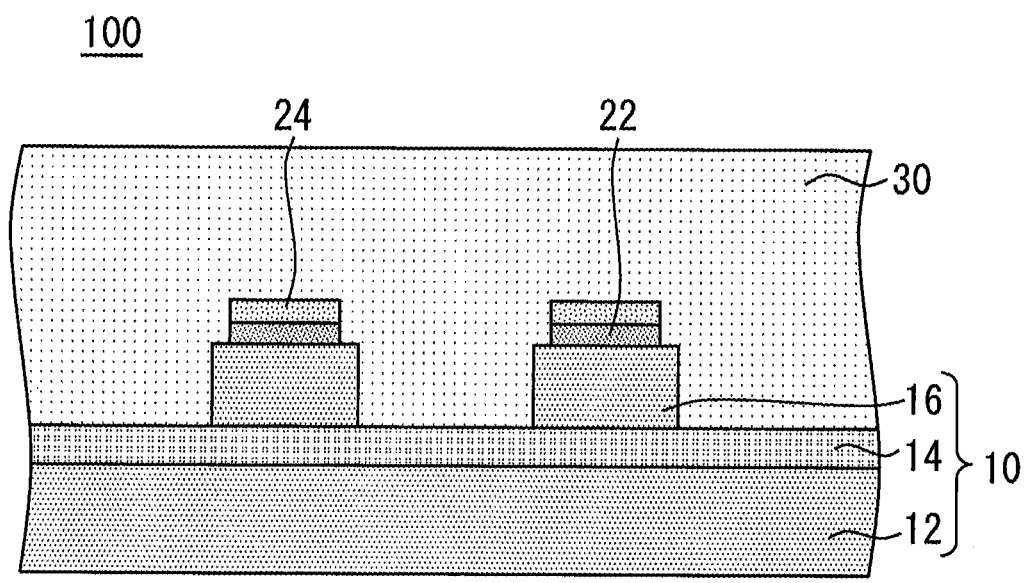
FIG. 2 is an expanded view of the semiconductor device according to the first embodiment.

FIG. 2 is an expanded view of the semiconductor device 100 according to the first embodiment. The insulating substrate 10 has a base plate 12, an organic insulating layer 14 provided on the base plate 12, and circuit patterns 16 provided on the organic insulating layer 14. The semiconductor chips 24 are provided on the upper surfaces of the circuit patterns 16 via the joining materials 22. In FIG. 2, wires are omitted. The base plate 12 and the circuit patterns 16 are formed, for example, of copper. The organic insulating layer 14 is formed of resin such as epoxy resin or liquid crystal polymer. The thickness of the organic insulating layer 14 is, for example, 0.1 mm to 0.2 mm.

In the present embodiment, the semiconductor device 100 includes two semiconductor chips 24. Not limited to this, the semiconductor device 100 only has to include one or more semiconductor chips 24. Moreover, the plurality of semiconductor chips 24 may include different kinds of semiconductor chips.

The thickness of the circuit pattern 16 is not less than 1 mm and not more than 3 mm. The width of the upper surface of the circuit pattern 16 is equal to the width of the lower surface thereof. Here, the lower surface of the circuit pattern 16 is the opposite surface to the upper surface thereof, and the surface facing the organic insulating layer 14. The shape of a cross section, of the circuit pattern 16, that is perpendicular to the upper surface of the organic insulating layer 14 is rectangular. The width of the upper surface of the circuit pattern 16 is, for example, 1.2 times the chip width.

Next, a method for manufacturing the semiconductor device 100 is described. First, as a method for manufacturing the insulating substrate 10, the organic insulating layer 14 and two metal layers are pasted together in a mode where the organic insulating layer 14 is sandwiched by the metal layers. After that, the organic insulating layer 14 and the metal layers are heated and a pressure is applied to those. Thereby, the metal layers are formed on both surfaces on the upper surface side and the lower surface side of the organic insulating layer 14. The metal layer is a conductive plate such, for example, as a copper plate. The metal layers become the circuit patterns 16 and the base plate 12 through processing mentioned later. The metal layer that is used as the circuit patterns 16 has a thickness not less than 1 mm and not more than 3 mm. The metal layer that is used as the base plate 12 has, for example, a thickness of 2 mm.

Next, the metal layer is patterned by machining processing to form the circuit patterns 16. The machining processing is, for example, cutting processing or router processing. Next, the semiconductor chips 24 are provided on the upper surfaces of the circuit patterns 16. Next, the casing 20 and the terminals 26 and 28 are mounted on the insulating substrate 10. Next, the terminals 26 and 28 are connected to the semiconductor chips 24 and the circuit patterns 16 with wires. Next, the interior of the casing 20 is sealed with the sealing resin 30.

With the present embodiment, the organic insulating layer 14 is used for the insulating substrate 10, and thereby, production costs can be more reduced than for a ceramic insulating substrate. Here, the organic insulating layer 14 has less heat conductivity than ceramics. The heat conductivity of the organic insulating layer 14 is, for example, 5 to 20 W/m·K. Moreover, heat conductivities of ceramics are approximately 70 W/m·K for silicon nitride, and approximately 170 W/m·K for aluminum nitride. Therefore, the insulating substrate 10 possibly has a large heat resistance under the influence of the organic insulating layer 14.

Figure 3:
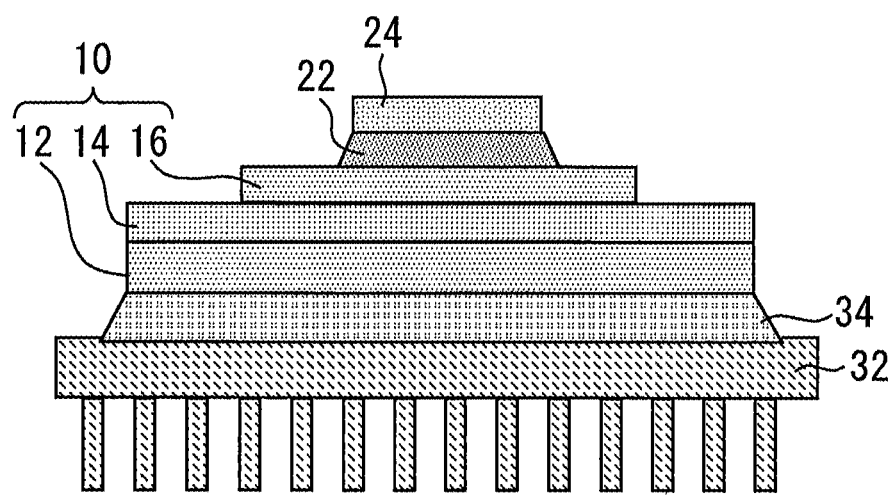
FIG. 3 is a diagram for explaining the configuration of the semiconductor device which was used for simulation of the heat resistance.

To confirm this, there were calculated values of heat resistance of a semiconductor device 100a in the case where the thickness of the circuit pattern 16 was changed. FIG. 3 is a diagram for explaining the configuration of the semiconductor device 100a which was used for simulation of the heat resistance. In the semiconductor device 100a, the insulating substrate 10 is joined onto the upper surface of an air-cooling fin 32 via heat dissipating grease 34. The heat dissipating grease 34 is sandwiched between the air-cooling fin 32 and the insulating substrate 10. The air-cooling fin 32 is formed of aluminum. The semiconductor chip 24 is joined onto the upper surface of the insulating substrate 10 with the solder 22.

Figure 4:
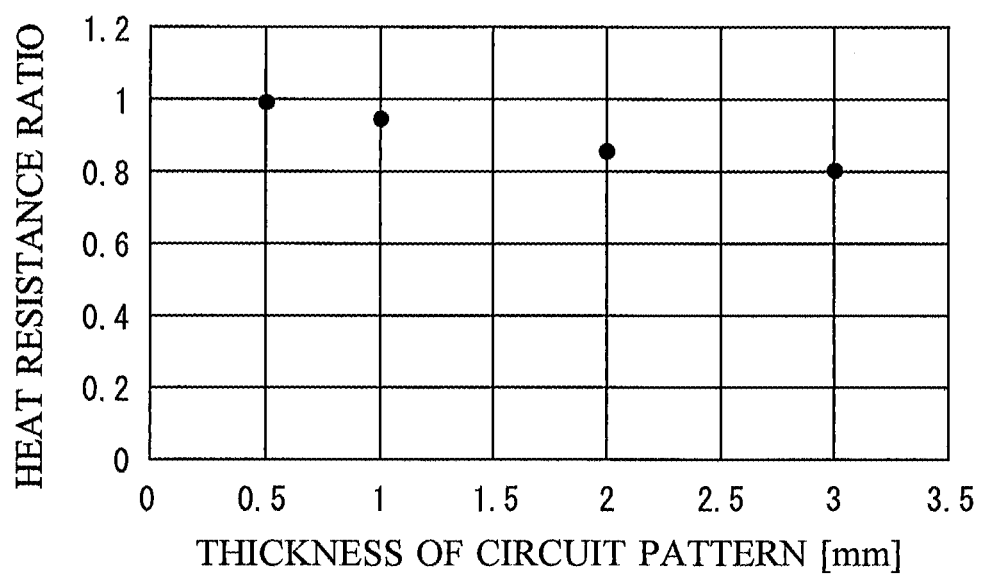
FIG. 4 is a diagram presenting the results of calculation of the heat resistance.

FIG. 4 is a diagram presenting the results of calculation of the heat resistance. FIG. 4 presents the results of calculation by the simulation of heat resistance between the semiconductor chip 24 and the base plate 12. Moreover, FIG. 4 presents heat resistance ratios relative to the heat resistance in the case of the circuit pattern 16 with 0.5 mm of thickness. The thicker the circuit pattern 16 is, the lower the heat resistance drops.

The present embodiment affords the significant effect of reducing the heat resistance with the thickness of the circuit pattern 16 being not less than 1 mm. In the case of the circuit pattern 16 having 2.0 mm of thickness, the heat resistance can be reduced by approximately 15% as compared with the case of having 0.5 mm. In this case, the heat resistance of the semiconductor device 100a can be made equivalent to the heat resistance in the case of using a ceramic insulating substrate composed of aluminum nitride. Moreover, as the circuit pattern 16 is thicker, a change amount in heat resistance relative to a change amount in thickness of the circuit pattern 16 is smaller. The effect of reducing the heat resistance tends to converge with the thickness of the circuit pattern 16 being not less than 3 mm.

According to the above, in the present embodiment, the thickness of the circuit pattern 16 is desirable to be not less than 1 mm and not more than 3 mm. This enables heat generated by the semiconductor chip 24 to sufficiently disperse through the circuit pattern 16 before the heat reaches the organic insulating layer 14. Accordingly, the heat resistance of the semiconductor device 100 can be reduced.

Moreover, the thickness of the circuit pattern 16 may be not less than 2 mm. Thereby, even use of the organic insulating layer 14 can afford heat resistance equivalent to that of the ceramic insulating substrate or lower than that of the ceramic insulating substrate.

Moreover, for organic insulating substrates, in general, there is occasionally a case of forming an organic insulating layer to be thin in order to reduce heat resistance. With the present embodiment, since the heat resistance can be reduced with the circuit pattern 16, the organic insulating layer 14 can be provided to be thick. Accordingly, the withstand voltage of the insulating substrate 10 can be improved.

Figure 5:
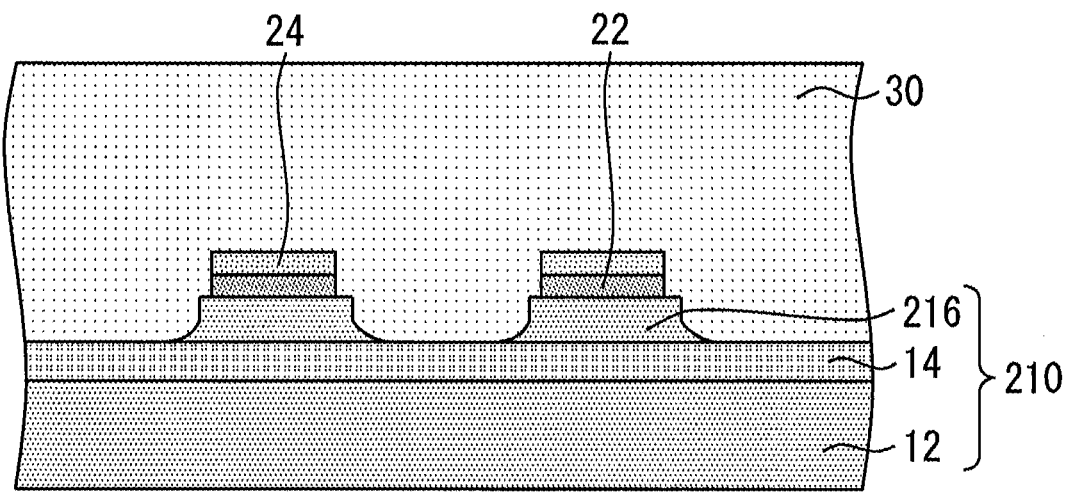
FIG. 5 is a cross-sectional view of a semiconductor device according to a comparative example of the first embodiment.

FIG. 5 is a cross-sectional view of a semiconductor device 200 according to a comparative example of the first embodiment. The semiconductor device 200 includes an insulating substrate 210. The insulating substrate 210 includes circuit patterns 216. The semiconductor device 200 is different from the semiconductor device 100 in a method of forming the circuit patterns 216. The circuit patterns 216 are formed by etching a metal layer. In this case, an etching factor causes the width of the lower surface of the circuit pattern 216 to be greater than the width of the upper surface thereof.

An etching amount in the transverse direction is larger as the circuit pattern 216 is thicker. Therefore, as the circuit pattern 216 is thicker, the difference between the width of the lower surface of the circuit pattern 216 and the width of the upper surface thereof is larger. Accordingly, as the circuit pattern 216 is thicker, the distance between the circuit patterns 216 needs to be larger. This may cause the semiconductor device 200 to be upsized when the circuit pattern 216 is made thick.

On the contrary, in the present embodiment, the circuit patterns 16 are formed by machining processing. Therefore, the shape of a cross section, of the circuit pattern 16, perpendicular to the upper surface of the organic insulating layer 14 can be made rectangular. Accordingly, as compared with the case of forming the circuit patterns 16 by etching, the distance between the circuit patterns 16 can be made close. Therefore, the circuit pattern 16 can be made thick while suppressing the semiconductor device 100 to be upsized. Moreover, since sectional areas of the circuit patterns 16 can be made large, the current density of the semiconductor device 100 can be made large.

In the present embodiment, the circuit patterns 16 are formed by machining processing. As a modification of this, a metal layer may be processed by machining processing from its upper surface down to a certain depth to process its remaining portion by etching. For example, after the metal layer is processed by machining processing until the rest of its portion to be processed has 50 μm of thickness, the rest of the portion to be processed may be removed by etching. Thereby, as compared with the case of forming the circuit patterns 16 only by machining processing, the organic insulating layer 14 can be more prevented from being mechanically damaged in forming the circuit patterns 16.

Figure 6:
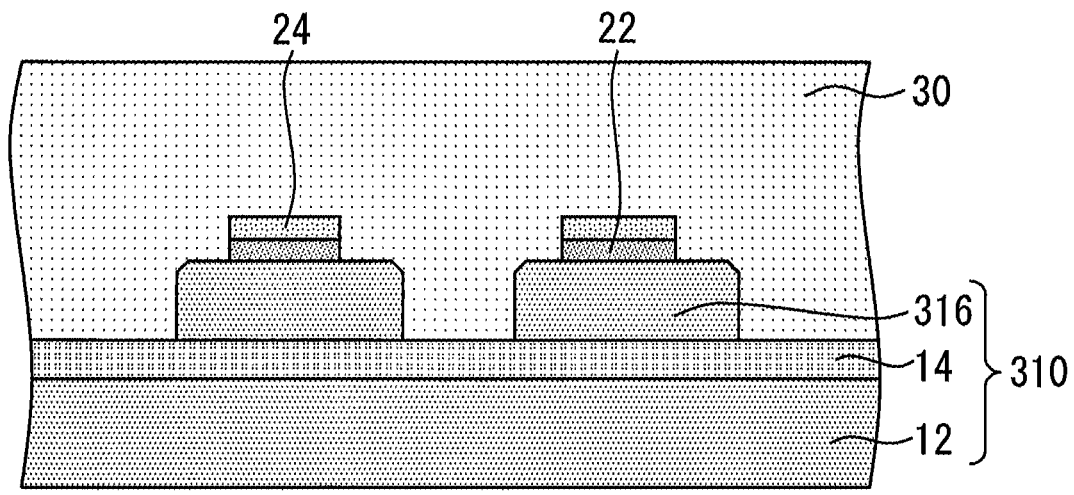
FIG. 6 is a cross-sectional view of a semiconductor device according to a first modification of the first embodiment.

FIG. 6 is a cross-sectional view of a semiconductor device 300 according to a first modification of the first embodiment. The semiconductor device 300 includes an insulating substrate 310. The insulating substrate 310 includes circuit patterns 316. Corners connecting the upper surfaces of the circuit patterns 316 to the lateral surfaces thereof are chamfered and rounded, for example, as illustrated in FIG. 6. The round corners of the circuit patterns 316 are formed by etching or machining processing. The upper surfaces of the circuit patterns 316 smoothly connect to the lateral surfaces thereof, and thereby, stress arising on the sealing resin 30 can be relieved. Accordingly, the sealing resin 30 can be suppressed from breaking due to cracks.

Figure 7:
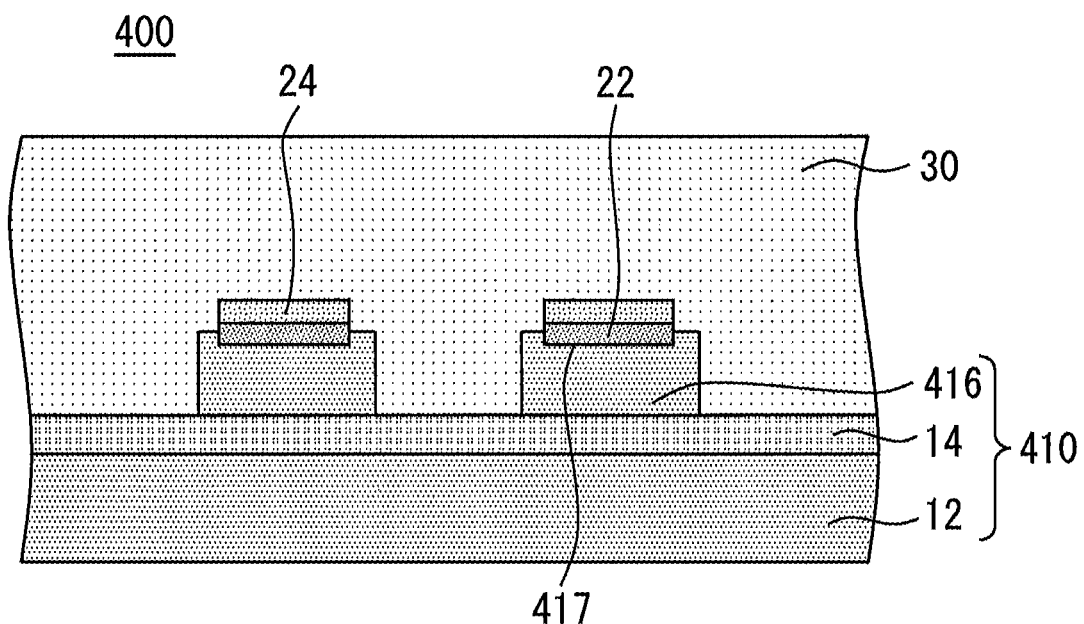
FIG. 7 is a cross-sectional view of a semiconductor device according to a second modification of the first embodiment.

FIG. 7 is a cross-sectional view of a semiconductor device 400 according to a second modification of the first embodiment. The semiconductor device 400 includes an insulating substrate 410. The insulating substrate 410 includes circuit patterns 416. Recess parts 417 are formed on the upper surfaces of the circuit patterns 416. The recess parts 417 are formed by half etching or machining processing. The joining materials 22 are provided in the recess parts 417. The joining materials 22 and the semiconductor chips 24 are contained inside the recess parts 417 in plan view. Thereby, positional displacement on the joining materials 22 and the semiconductor chips 24 can be suppressed. Accordingly, productivity can be improved.

Figure 8:
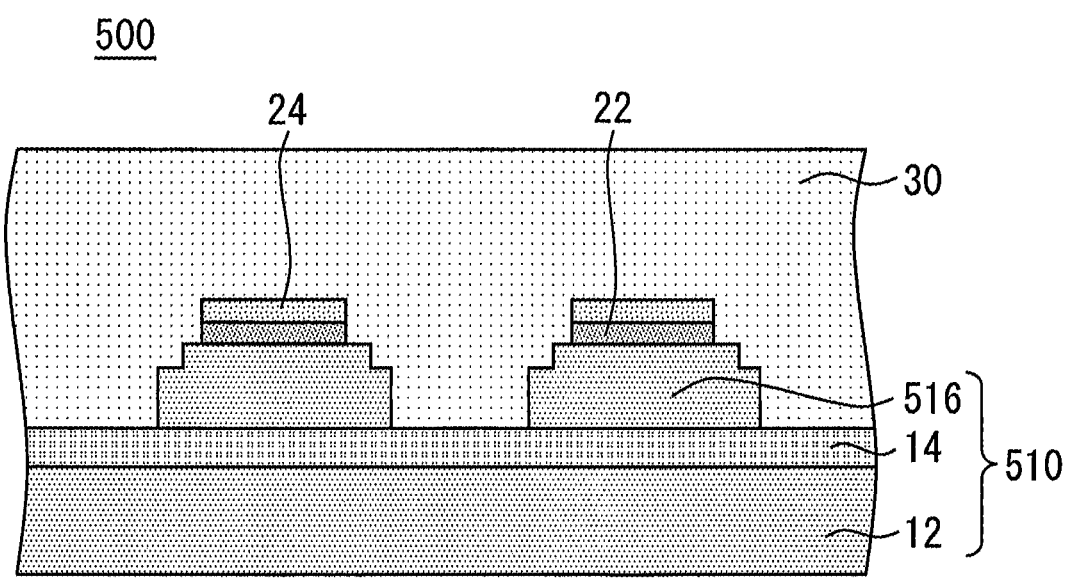
FIG. 8 is a cross-sectional view of a semiconductor device according to a third modification of the first embodiment.

FIG. 8 is a cross-sectional view of a semiconductor device 500 according to a third modification of the first embodiment. The semiconductor device 500 includes an insulating substrate 510. The insulating substrate 510 includes circuit patterns 516. A step is formed on the circuit pattern 516. The step allows the circuit pattern 516 to be thicker as going inward. The steps are formed by half etching or machining processing. The semiconductor chip 24 is joined onto the top most stage, of the circuit pattern 516, which is at the center part thereof. Therefore, the semiconductor chip 24 can be easily positioned to its mounting position. Accordingly, positional displacement on the joining materials 22 and the semiconductor chips 24 can be suppressed, and productivity can be improved. Moreover, the sealing resin 30 that is in contact with the steps function as an anchor. Therefore, the sealing resin 30 can be suppressed from peeling off from the insulating substrate 510.

The circuit pattern 516 is not limited to having one step but a plurality of steps may be formed in order to obtain a larger anchoring effect. Moreover, the steps may be formed on the circuit patterns 516 on both sides of each of the semiconductor chips 24 or on one side of each of these.

Figure 9:
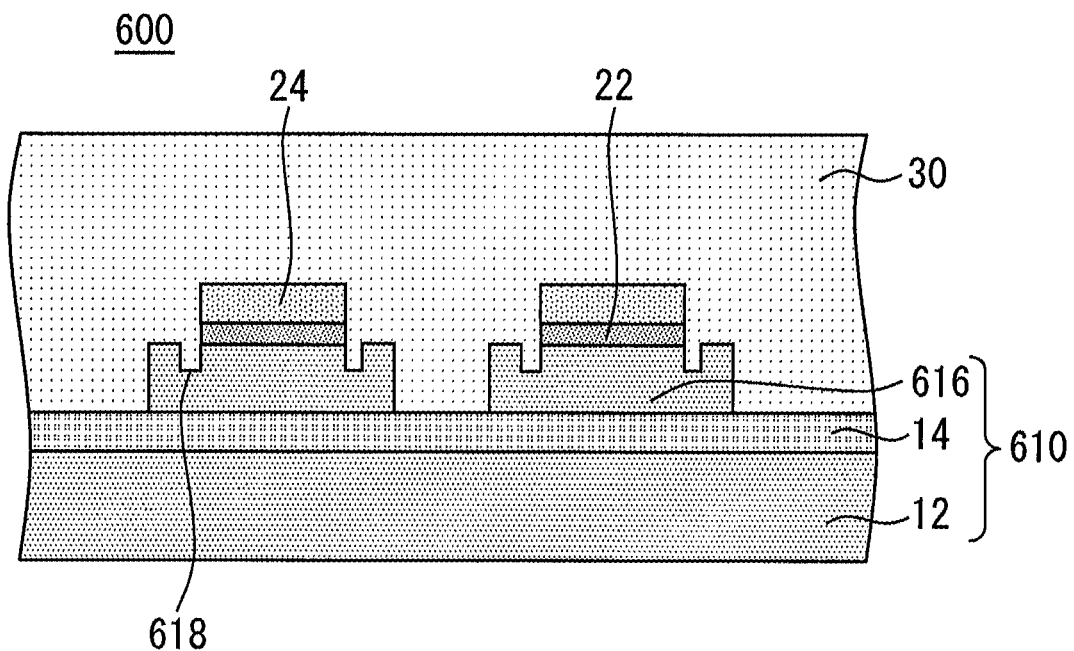
FIG. 9 is a cross-sectional view of a semiconductor device according to a fourth modification of the first embodiment.

FIG. 9 is a cross-sectional view of a semiconductor device 600 according to a fourth modification of the first embodiment. The semiconductor device 600 includes an insulating substrate 610. The insulating substrate 610 includes circuit patterns 616. Grooves 618 are formed on the circuit patterns 616. The grooves 618 are formed outside regions, of the circuit patterns 616, that the semiconductor chips 24 are mounted on. The grooves 618 are formed by half etching or machining processing. The sealing resin 30 embedded in the grooves 618 function as an anchor. Therefore, the sealing resin 30 can be suppressed from peeling off from the insulating substrate 610. Accordingly, reliability can be improved.

The sectional shape of the groove 618 is rectangular or square. Not limited to this, the sectional shape of the groove 618 may be trapezoidal, triangular, polygonal or semicircular. Moreover, the sectional shape of the groove 618 may be a shape the width of which is smaller as coming closer to the upper surface of the circuit pattern 616. Moreover, the grooves 618 may be formed on the circuit patterns 616 on both sides of each of the semiconductor chips 24 or the groove 618 may be formed on one side of each of these.

Figure 10:
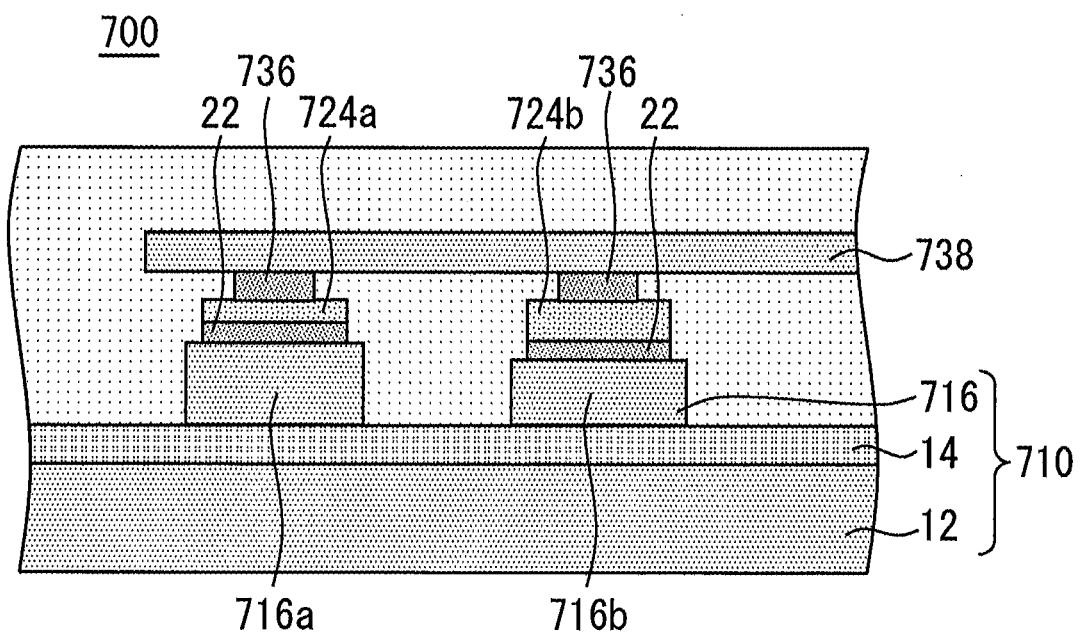
FIG. 10 is a cross-sectional view of a semiconductor device according to a fifth modification of the first embodiment.

FIG. 10 is a cross-sectional view of a semiconductor device 700 according to a fifth modification of the first embodiment. The semiconductor device 700 includes an insulating substrate 710. The insulating substrate 710 includes circuit patterns 716. The circuit patterns 716 include a first circuit pattern 716a and a second circuit pattern 716b. The second circuit pattern 716b is thinner than the first circuit pattern 716a.

Moreover, the semiconductor chips 24 include a first semiconductor chip 724a provided on the upper surface of the first circuit pattern 716a, and a second semiconductor chip 724b provided on the upper surface of the second circuit pattern 716b. The second semiconductor chip 724b is thicker than the first semiconductor chip 724a. A terminal 738 is provided over the first semiconductor chip 724a and the second semiconductor chip 724b. Both the upper surface of the first semiconductor chip 724a and the upper surface of the second semiconductor chip 724b are joined to the terminal 738 with joining materials 736. The terminal 738 is flat plate-shaped.

In the semiconductor device 700, the difference in thickness between the first semiconductor chip 724a and the second semiconductor chip 724b is cancelled by the circuit patterns 716. In other words, the height of the upper surface of the first semiconductor chip 724a from the organic insulating layer 14 is equal to the height of the upper surface of the second semiconductor chip 724b from the organic insulating layer 14. Thereby, the semiconductor device 700 can be easily assembled. Accordingly, productivity can be improved.

Notably, the semiconductor chips 24 may be made with wide bandgap semiconductor instead of silicon. The wide bandgap semiconductor is silicon carbide, a gallium nitride-based material, or diamond. Forming the semiconductor chips 24 with the wide bandgap semiconductor enables a withstand voltage property of the semiconductor device 100 to be further improved.

Moreover, the semiconductor chips 24 made with the wide bandgap semiconductor can be further improved in heat resistance property. Accordingly, the air-cooling fin 32 can be downsized, which can lead to downsizing of the semiconductor device 100. Moreover, the semiconductor device 100 can operate at high temperature. Furthermore, the semiconductor device 100 can achieve its higher efficiency since electric power losses can be reduced.

These modifications can be appropriately applied to a semiconductor device, an electric power conversion apparatus, and a method for manufacturing a semiconductor device according to embodiments below. Meanwhile, for the semiconductor device, the electric power conversion apparatus, and the method for manufacturing the semiconductor device according to the embodiments below, dissimilarities with the first embodiment will mainly be explained as they have many similarities with the first embodiment.

Second Embodiment

In the present embodiment, the aforementioned semiconductor device 100 according to the first embodiment is applied to an electric power conversion apparatus. The present embodiment is not limited to a specific electric power conversion apparatus but includes, as described below as a second embodiment, a case where the semiconductor device 100 according to the first embodiment is applied to a three-phase inverter.

Figure 11:
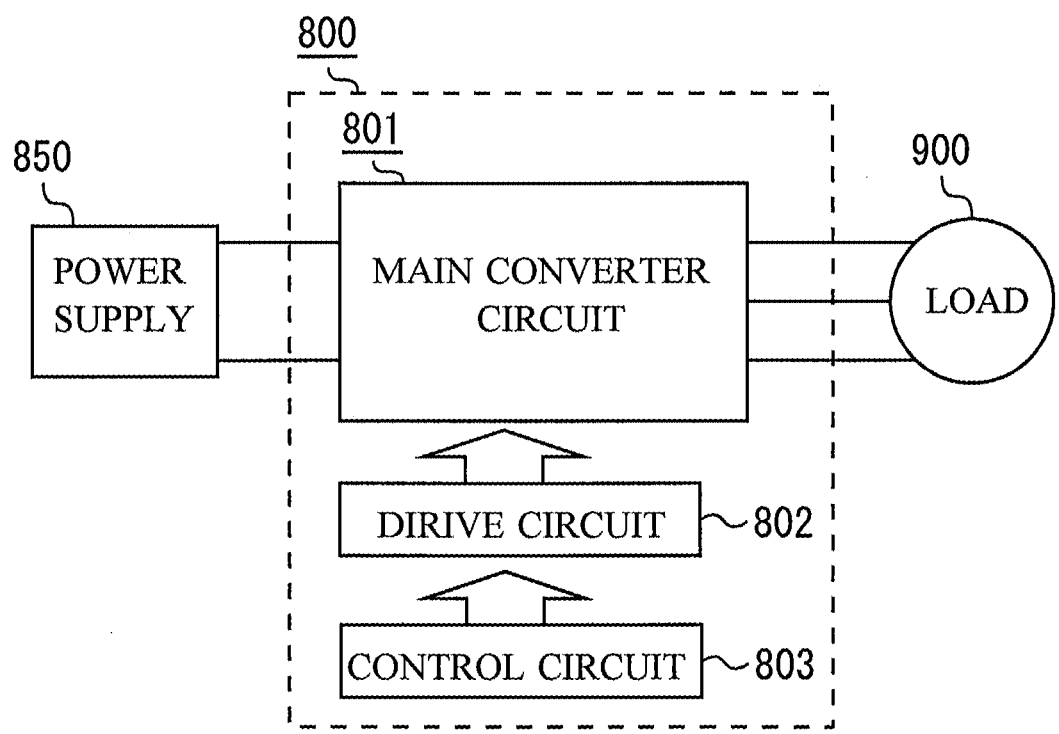
FIG. 11 is a block diagram illustrating a configuration of an electric power conversion system to which an electric power conversion apparatus according to the second embodiment is applied.

FIG. 11 is a block diagram illustrating a configuration of an electric power conversion system to which an electric power conversion apparatus 800 according to the present embodiment is applied.

The electric power conversion system illustrated in FIG. 11 is constituted of a power supply 850, the electric power conversion apparatus 800 and a load 900. The power supply 850 is a DC power supply and supplies DC electric power to the electric power conversion apparatus 800. The power supply 850 can be constituted of various components, and can be constituted, for example, of a DC system, solar cells and storage batteries. Moreover, the power supply 850 may be constituted of a rectifier circuit or an AC/DC converter connected to an AC system. Otherwise, the power supply 850 may be constituted of a DC/DC converter which converts DC electric power output from a DC system into predetermined electric power.

The electric power conversion apparatus 800 is a three-phase inverter connected between the power supply 850 and the load 900. The electric power conversion apparatus 800 converts DC electric power supplied from the power supply 850 into AC electric power and supplies the AC electric power to the load 900. As illustrated in FIG. 11, the electric power conversion apparatus 800 includes a main converter circuit 801, a drive circuit 802 and a control circuit 803. The main converter circuit 801 converts DC electric power into AC electric power and outputs it. The drive circuit 802 outputs a drive signal for driving each switching device of the main converter circuit 801. The control circuit 803 outputs a control signal for controlling the drive circuit 802 to the drive circuit 802.

The load 900 is a three-phase motor driven by the AC electric power supplied from the electric power conversion apparatus 800. Notably, the load 900 is not limited to a specific use but is any of motors mounted on various electric devices. The load 900 is used, for example, for a motor for a hybrid vehicle, an electric vehicle, a train, an elevator or an air conditioner.

Hereafter, details of the electric power conversion apparatus 800 are described. The main converter circuit 801 includes not-shown switching devices and freewheel diodes. The main converter circuit 801 converts DC electric power supplied from the power supply 850 into AC electric power by switching of the switching devices, and supplies the AC electric power to the load 900. The main converter circuit 801 can employ any of various specific circuit configurations, and the main converter circuit 801 according to the present embodiment is a two-level three-phase full bridge circuit. Such a two-level three-phase full bridge circuit can be constituted of six switching devices and six freewheel diodes which are in anti-parallel to the individual switching devices. To the plurality of switching devices of the main converter circuit 801, the semiconductor device according to any of the aforementioned first embodiment is applied. Every two switching devices of the six switching devices are connected in series and constitute upper and lower arms. Each pair of the upper and lower arms constitute a phase (a U-phase, a V-phase or a W-phase) of the full bridge circuit. Further, output terminals of the individual upper and lower arms, that is, three output terminals of the main converter circuit 801 are connected to the load 900.

The drive circuit 802 generates drive signals for driving the switching devices of the main converter circuit 801 and supplies them to control electrodes of the switching devices of the main converter circuit 801. Specifically, the drive circuit 802 outputs drive signals for bringing switching devices into ON states and drive signals for bringing switching device into OFF states to the control electrodes of the switching devices in accordance with a control signal from the control circuit 803 mentioned later. When the switching device is maintained in the ON state, the drive signal is an ON signal which is a voltage signal not less than the threshold voltage of the switching device. When the switching device is maintained in the OFF state, the drive signal is an OFF signal which is a voltage signal not more than the threshold voltage of the switching device.

The control circuit 803 controls the switching devices of the main converter circuit 801 such that desired electric power is supplied to the load 900. Specifically, the control circuit 803 calculates an ON time which is a time period for which each switching device of the main converter circuit 801 has to be in the ON state on the basis of the electric power to be supplied to the load 900. For example, the main converter circuit 801 can be controlled by PWM control in which the ON time of the switching devices is modulated in accordance with a voltage to be output. The control circuit 803 outputs a control signal which is a control instruction to the drive circuit 802 such that the ON signals are output to the switching devices to be brought into the ON states and the OFF signals are output to the switching devices to be brought into the OFF states at each time point. In accordance with the control signal, the drive circuit 802 outputs the ON signal or the OFF signal to the control electrode of each switching device as a drive signal.

Since to the electric power conversion apparatus 800 according to the present embodiment, the semiconductor device 100 according to the first embodiment is applied as the switching devices of the main converter circuit 801, efficient heat dissipation from the electric power conversion apparatus 800 to be achieved.

While for the present embodiment, there has been exemplarily described an example in which the first embodiment is applied to the two-level three-phase inverter, the present embodiment is not limited to this but it can be applied to various electric power conversion apparatuses. The two-level electric power conversion apparatus in the present embodiment may be replaced by a three-level or multi-level electric power conversion apparatus. Moreover, when electric power is supplied to a single-phase load, the first embodiment may be applied to a single-phase inverter. Moreover, when electric power is supplied to a DC load, the first embodiment can be applied to a DC/DC converter or an AC/DC converter.

Moreover, for the electric power conversion apparatus 800 to which the first embodiment is applied, the load 900 is not limited to a motor. Therefore, it can also be used, for example, as a power supply device of an electric discharge machine, a laser beam machine, an induction heating cooker or a wireless power feed system. Furthermore, the electric power conversion apparatus 800 can also be used as a power conditioner of a solar power generation system, a power storage system, or the like.

The technical features described in the foregoing embodiments can be used in various combinations as required.

With the semiconductor device and the method for manufacturing a semiconductor device according to the present invention, the thickness of the circuit pattern is set to be not less than 1 mm and not more than 3 mm, and thereby, even use of the organic insulating layer low in heat conductivity enables sufficient heat dissipation from the circuit pattern to be achieved. Accordingly, efficient heat dissipation can be achieved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2018-216711, filed on Nov. 19, 2018 including specification, claims, drawings and summary, on which the Convention priority of the present application is based, are incorporated herein by reference in its entirety.

The invention claimed is:

1. A semiconductor device comprising:
   an insulating substrate having an organic insulating layer and a circuit pattern provided on the organic insulating layer; and
   a semiconductor chip provided on an upper surface of the circuit pattern, wherein
   a thickness of the circuit pattern is not less than 1 mm and not more than 3 mm, and
   a recess part is formed on the upper surface of the circuit pattern, and the semiconductor chip is contained inside the recess part in plan view.

2. The semiconductor device according to claim 1, wherein a width of the upper surface of the circuit pattern is equal to a width of a lower surface opposite to the upper surface.

3. The semiconductor device according to claim 1, wherein the thickness of the circuit pattern is not less than 2 mm.

4. The semiconductor device according to claim 1, wherein a corner connecting the upper surface of the circuit pattern to a lateral surface of the circuit pattern is rounded.

5. The semiconductor device according to claim 1, wherein a step is formed on the circuit pattern such that the circuit pattern is thicker as going inward.

6. The semiconductor device according to claim 1, wherein a groove is formed on the circuit pattern outside a region that the semiconductor chip is mounted on.

7. The semiconductor device according to claim 1, wherein the semiconductor chip is made with wide bandgap semiconductor.

8. The semiconductor device according to claim 7, wherein the wide bandgap semiconductor is silicon carbide, a gallium nitride-based material, or diamond.

9. A semiconductor device comprising:
   an insulating substrate having an organic insulating layer and a circuit pattern provided on the organic insulating layer; and
   a semiconductor chip provided on an upper surface of the circuit pattern, wherein
   a thickness of the circuit pattern is not less than 1 mm and not more than 3 mm,
   the circuit pattern includes a first circuit pattern and a second circuit pattern thinner than the first circuit pattern, and
   the semiconductor chip includes a first semiconductor chip provided on an upper surface of the first circuit pattern, and a second semiconductor chip provided on an upper surface of the second circuit pattern, the second semiconductor chip being thicker than the first semiconductor chip.

10. An electric power conversion apparatus comprising:
    a main converter circuit that has the semiconductor device and converts and outputs input electric power, the semiconductor device including:
       an insulating substrate having an organic insulating layer and a circuit pattern provided on the organic insulating layer; and
       a semiconductor chip provided on an upper surface of the circuit pattern, wherein
       a thickness of the circuit pattern is not less than 1 mm and not more than 3 mm;
    a drive circuit that outputs a drive signal for driving the semiconductor device to the semiconductor device; and
    a control circuit that outputs a control signal for controlling the drive circuit to the drive circuit.

* * * * *